(12) United States Patent
Kane et al.

(10) Patent No.: US 6,888,224 B1
(45) Date of Patent: May 3, 2005

(54) METHODS AND SYSTEMS FOR FABRICATING ELECTRICAL CONNECTIONS TO SEMICONDUCTOR STRUCTURES INCORPORATING LOW-K DIELECTRIC MATERIALS

(75) Inventors: Terence Lawrence Kane, Wappingers Falls, NY (US); Michael P. Tenney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/609,784

(22) Filed: Jun. 30, 2003

Related U.S. Application Data

(62) Division of application No. 10/280,266, filed on Oct. 24, 2002, now Pat. No. 6,630,395.

(51) Int. Cl.$^7$ ............................................. H01L 23/58
(52) U.S. Cl. ...................... 257/635; 257/762; 257/750; 257/632; 257/643; 257/644; 257/650; 257/774

(58) Field of Search ................................ 257/762, 750, 257/632, 643, 635, 644, 650, 774

(56) References Cited

U.S. PATENT DOCUMENTS 6,514,881 B1    2/2003  Coffman

Primary Examiner—Eddie Lee
Assistant Examiner—Thomas Magee
(74) Attorney, Agent, or Firm—Lisa J. Ulrich

(57) ABSTRACT

Low-k dielectric materials have desirable insulating characteristics for use in insulating sub micron conductors in semiconductor devices. However, certain physical and material characteristics of the low-k dielectric materials make them difficult to work with. More particularly, the soft, porous, leakage-prone characteristics of low-k materials makes it difficult to accommodate electrical contacts for electrical probing to conductors covered by such materials. The present invention provides methods and structures for facilitating the electrical probing of semiconductor device conductors insulated by overlying low-k layers of dielectric material.

4 Claims, 7 Drawing Sheets

METHODS AND SYSTEMS FOR FABRICATING ELECTRICAL CONNECTIONS TO SEMICONDUCTOR STRUCTURES INCORPORATING LOW-K DIELECTRIC MATERIALS

REFERENCE TO PRIOR APPLICATIONS

This application is a divisional application of application Ser. No. 10/280,266, filed on Oct. 24, 2002, now U.S. Pat. No. 6,630,395.

FIELD OF THE INVENTION

The present invention relates generally to electrical testing of circuits and more particularly to facilitating electrical probing by forming electrical connections to semiconductor structures incorporating low-k dielectric inter level materials.

BACKGROUND

The electrical characteristics of low-k dielectric materials make them desirable in the manufacture of semiconductor chips having sub micron features. Low-k dielectric materials include such commercial products as Dow Corning's SILK™ and porous SILK™, Applied Materials' Black Diamond™, Motorola's Black Diamond™, Texas Instrument's Coral™, and TSMC's Black Diamond™ and Coral™ and other organic polymers, porous oxides and carbon-doped oxides as described below. In one particular application of interest with respect to the present invention, these low-k dielectric materials are used to insulate sub-micron copper interconnects. The electrical characteristics of these low-k materials diminish the capacitive effects between the closely spaced electrical conductors. Such conductors include, for example, dual damascence-formed copper conductors used to make back-end-of-ine (BEOL), multilevel electrical connections to silicon devices such as transistors.

These low-k dielectric materials, however, possess certain chemical and mechanical characteristics that make them problematic for certain applications. They are, for example, soft, pliable and porous as well as prone to electrical leakage. These characteristics make it difficult to probe rough these materials to test the electrical characteristics of the underlying components. Processes typically used to open vias through the low-k dielectric materials, such as mechanical unlayering, reactive ion etching (RIE), focused ion beam (FIB) techniques and wet chemical removal processes either compromise the underlying structures to be tested or cause conductive leakage paths within the dielectric layers themselves, compromising sensitive electrical measurements.

It thus is difficult to electrically probe and analyze the electrical operating characteristics or fault characteristics of semiconductor devices fabricated using these low-k dielectric materials.

SUMMARY OF THE INVENTION

It is an object of the present invention to provide methods and structures for providing electrical connections to and hence enabling the electrical probing of conductors, semiconductor devices, structures and other features fabricated including low-k inter level dielectric materials.

In accordance with one embodiment of the invention, there is provided a method of providing electrical contacts to an insulated device structure comprising the steps of: providing a device including at least one buried conductor overlaid by a low-k dielectric layer, etching said low-k dielectric layer to leave a cap over said buried conductor, depositing a high-k dielectric layer over said cap; forming a via through said high-k dielectric layer and said cap to expose said buried conductor, passivating the sidewall of said via; and providing a conductor through said via to make electrical contact to said buried conductor.

In accordance with another embodiment of the invention, there is provided a semiconductor structure comprising: a buried semiconductor device; a first conductor overlying said semiconductor device and connected to said semiconductor device; a low-k dielectric layer surrounding said first conductor; a low-k dielectric cap overlying said first conductor, a high-k insulator layer deposited over said low-k dielectric cap; a via through said high-k insulator layer and said low-k dielectric cap exposing a surface of said first conductor; a passivating film of high-k dielectric insulator over the wall of said via; and a second conductor extending through said via over said passivating film to contact said first conductor.

BRIEF DESCRIPTION OF THE DRAWINGS

These and other objects, features and advantages of the invention will be apparent from a consideration of the detailed description of the invention set out below, in combination with the drawing Figures in which.

DETAILED DESCRIPTION OF THE INVENTION

Figure 1:
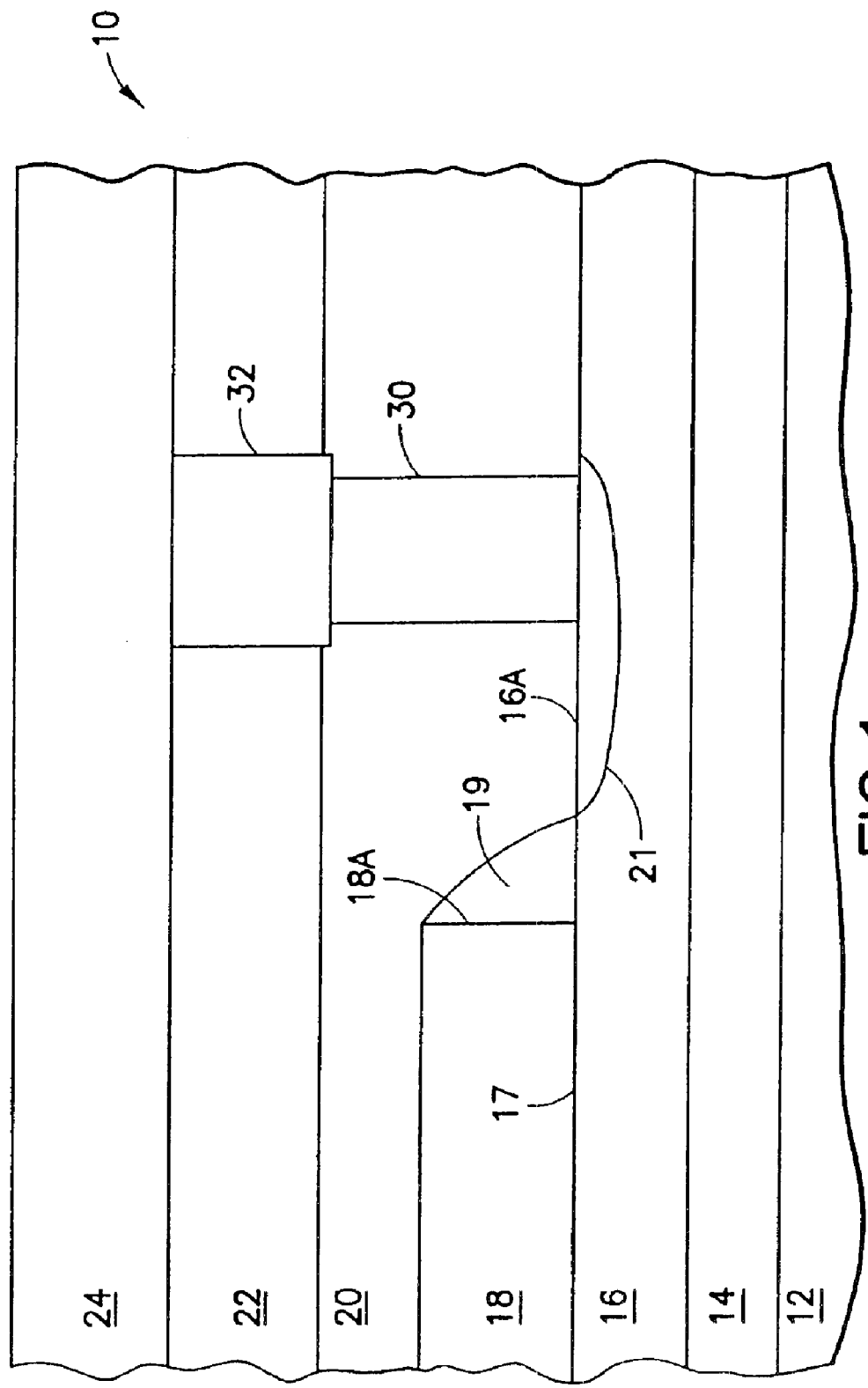
FIGS. 1 through 6 are cross-sectional views illustrating successive process steps and structures in accordance with one embodiment of the invention for establishing electrical contacts to semiconductor devices fabricated with low-k dielectric materials.

With reference now to FIG. 1, there is shown a silicon-on-insulator (SOI) semiconductor device 10 incorporating complementary metal oxide semiconductor (CMOS) transistors. SOI device 10 is formed over a silicon substrate 12 comprising a layer of intrinsic silicon. A buried oxide layer 14 overlies silicon substrate 12, for example comprising a thermally grown and bonded wafer or an ion implanted silicon dioxide layer.

A single crystal silicon layer 16 overlies buried oxide layer 14, for example comprising epitaxially grown, lightly doped silicon. A doped polysilicon region 18 overlies single crystal silicon layer 16, spaced therefrom by a thin layer of insulating gate oxide 17. Doped polysilicon region 18 terminates over single crystal silicon layer 16 at a vertical edge 18A, exposing a portion of the single crystal silicon layer surface 16A. An oxide insulating sidewall 19 is situated on vertical edge 18A, spacing doped polysilicon region 18 from a doped source/drain implant region 21 deposited in single crystal silicon layer 16.

An insulating layer of boron phosphorous silicon glass (BPSG) 20 overlies doped polysilicon region 18, sidewall 19 and the exposed surface 16A of single crystal silicon layer 16 containing source/drain region 21.

Two consecutive layers of low-k dielectric films 22, 24, respectively, overlie BPSG layer 20. As used herein, low-k dielectric films comprise those films having a k factor of about 2.85 or less, typically comprising PECVD-deposited SiCOH films and compounds thereof, PECVD-deposited carbon-doped oxides and other organic polymers and porous oxides. Commercially available low-k dielectric products and materials include Dow Corning's SiLK™ and porous SILK™, Applied Materials' Black Diamond™, Motorola's Black Diamond™, Texas Instruments's Coral™, and TSMC's Black Diamond™ and Coral™.

A first level of conductive interconnect material, for example comprising a chemical vapor deposited (CVD) tungsten conductor 30, extends through BPSG layer 20 to contact the surface of source/drain region 21. A second level of conductive interconnect material, for example comprising a copper or tungsten conductor 32, extends through low-k dielectric film layer 22 to connect to the upper surface of interconnect material 30.

It will be appreciated that for purposes of describing the present invention, semiconductor device 10 comprises a portion of a conventional CMOS transistor structure fabricated in a silicon-on-insulator (SOI) structure and including sub micron copper BEOL interconnects insulated by low-k dielectric insulating layers. Many different methods and general structures are known for fabricating such a device. For example and without limitation, co-pending application Ser. No. 10/280,513 titled "Method of Reworking Structures Incorporating Low-K Dielectric Materials," and filed on Oct. 24, 2002 by inventors Terrence Lawrence Kane, Chung Ping Eng, Brett H. Engel, Barry Jack Ginsberg, Dermott A. Macpherson, and John Charles Petrus shows one method of providing device 10 with the flat, exposed upper surface of low-k dielectric layer 24.

The present invention, however, is not limited to device 10 or to any particular method for forming device 10. Many different processes are known in the art for providing CMOS devices. Further, the present invention is not limited to CMOS devices, but has application to any structure including one or more low-k dielectric layers covering small-dimensioned, closely spaced electrical conductors which must be exposed for electrical probing. When used in a CMOS structure, the invention has particular application in CMOS devices having 130 nanometer ground rules; that is 130 nanometer or less gate lengths.

In the present embodiment, it is desired to obtain electrical access to conductor 32 for measuring electrical characteristics of conductors 30, 32 and the underlying semiconductor features of device 10.

Figure 2:
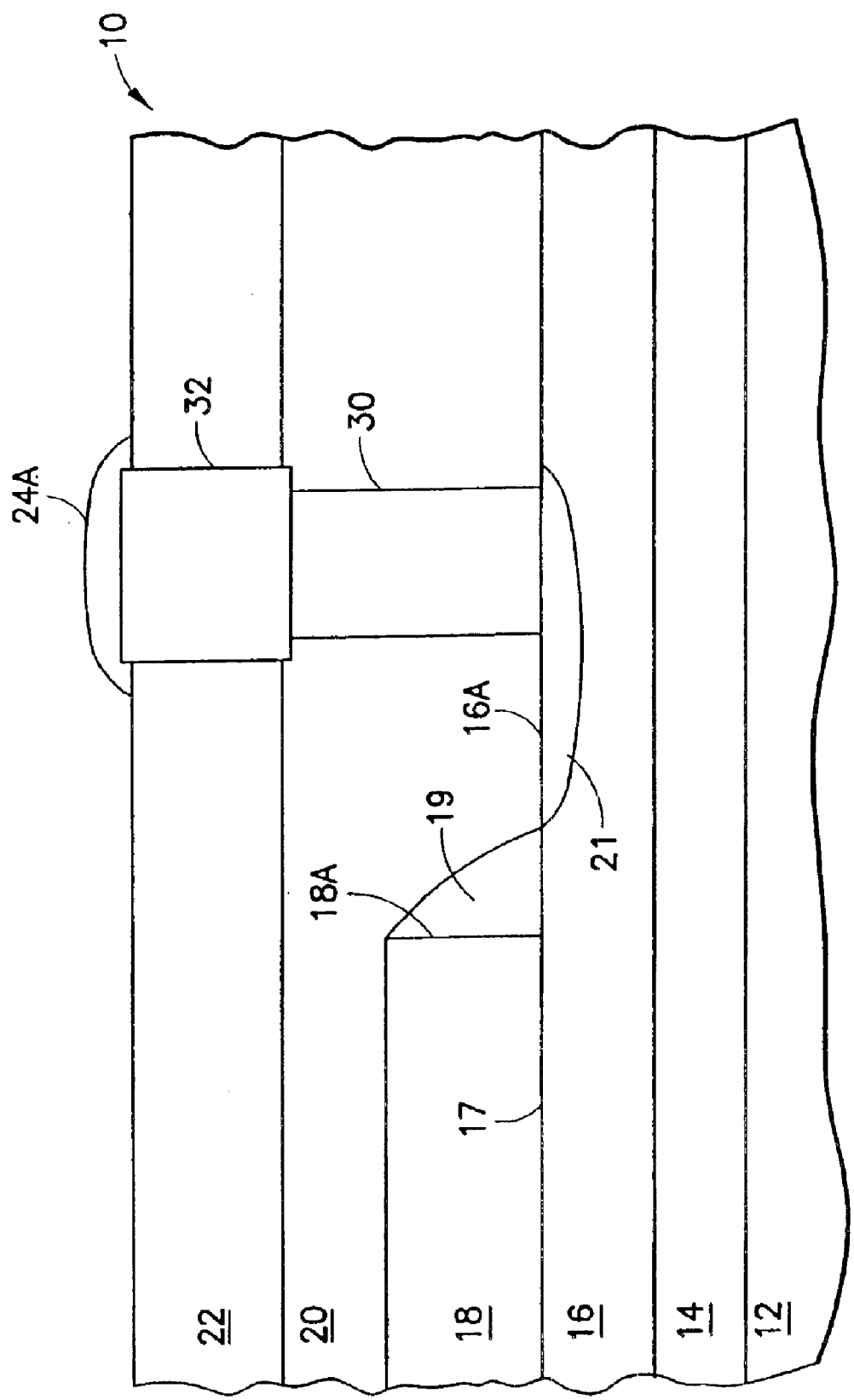

With reference now to FIG. 2, low-k dielectric layer 24 has been removed by using an appropriate isotropic etch such as a reactive ion etch (RIE), a plasma etch, selective low-angle ion milling, or chemical-assisted ion beam etching (CAIBE). Such etches are well known in the art and can be performed using an appropriate inert gas chemistry, selected dependent on the low-k dielectric film material, such as $CF_4$, $CHF_3CF_4$, $SF_6$ or $CF_3Cl$, mixed with oxygen, argon or helium.

Subsequent to the etch, layer 22 is recessed slightly below the upper surface of conductor 32 and a small region 24A of low-k dielectric layer 24 is seen to remain, capping conductor 32. It will be understood that such topography results from the use of an appropriate etch of the types described above.

Figure 3:
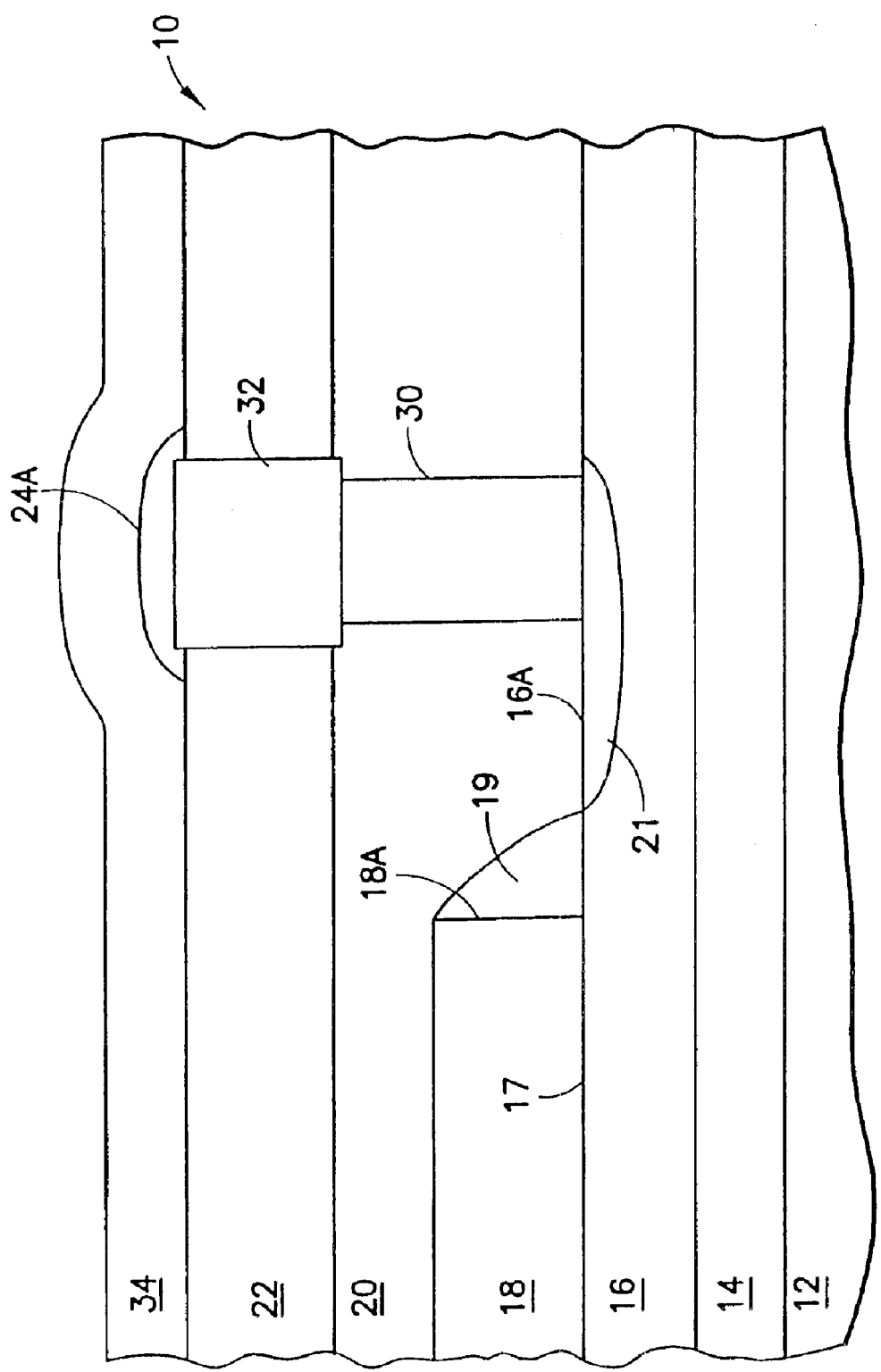

With reference now to FIG. 3, a high-k dielectric film or passivating layer 34 has been deposited conformally over the upper surface of the device, for example by chemical vapor deposition (CVD) or radio-frequency (RF) deposition. In one embodiment, layer 34 comprises tetraorthosilicate (TEOS) deposited by a conventional process to a thickness in the range of 500–2000 angstroms.

Figure 4:
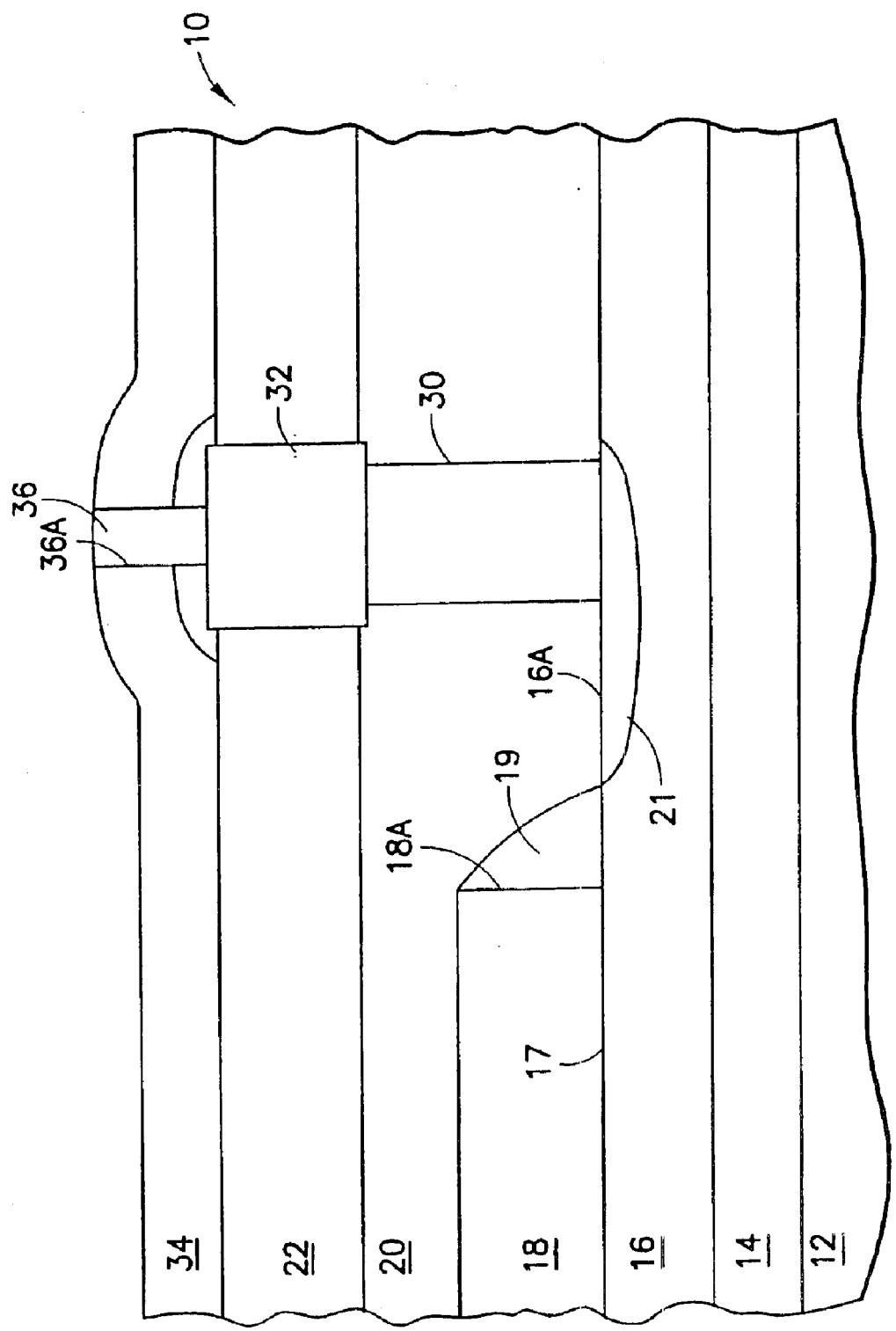

With reference now to FIG. 4, a sub micron via 36 is formed through layer 34 and cap 24A to expose the upper surface of conductor 32. Via 36, having an inner surface 36A, is formed by focused ion beam (FIB) milling. In one exemplary embodiment, flood gun or charge neutralized FIB operation is utilized with a beam current of about or less than 35 picoamps, a 50 micron or smaller diameter aperture and varying accelerating voltage setting. The mill diameter is about or less than 0.20 microns, for example in the 0.10–0.20 micron range, with a pitch spacing to adjacent features not to be disturbed of approximately 0.225 microns.

Different configurations of vias can be formed to contact different sizes and shapes of underlying conductors. For example, to contact an SRAM cell having a copper feature of about 0.22 microns underlying a 2000 Angstrom TEOS insulator layer, multiple vias can be formed, each with a diameter of about 0.10–0.20 microns or less. Single vias can be provided with an enlarged contact surface, and multiple vias can be joined, with conductive pads such as tungsten or platinum, one embodiment of which is described below.

Figure 5:
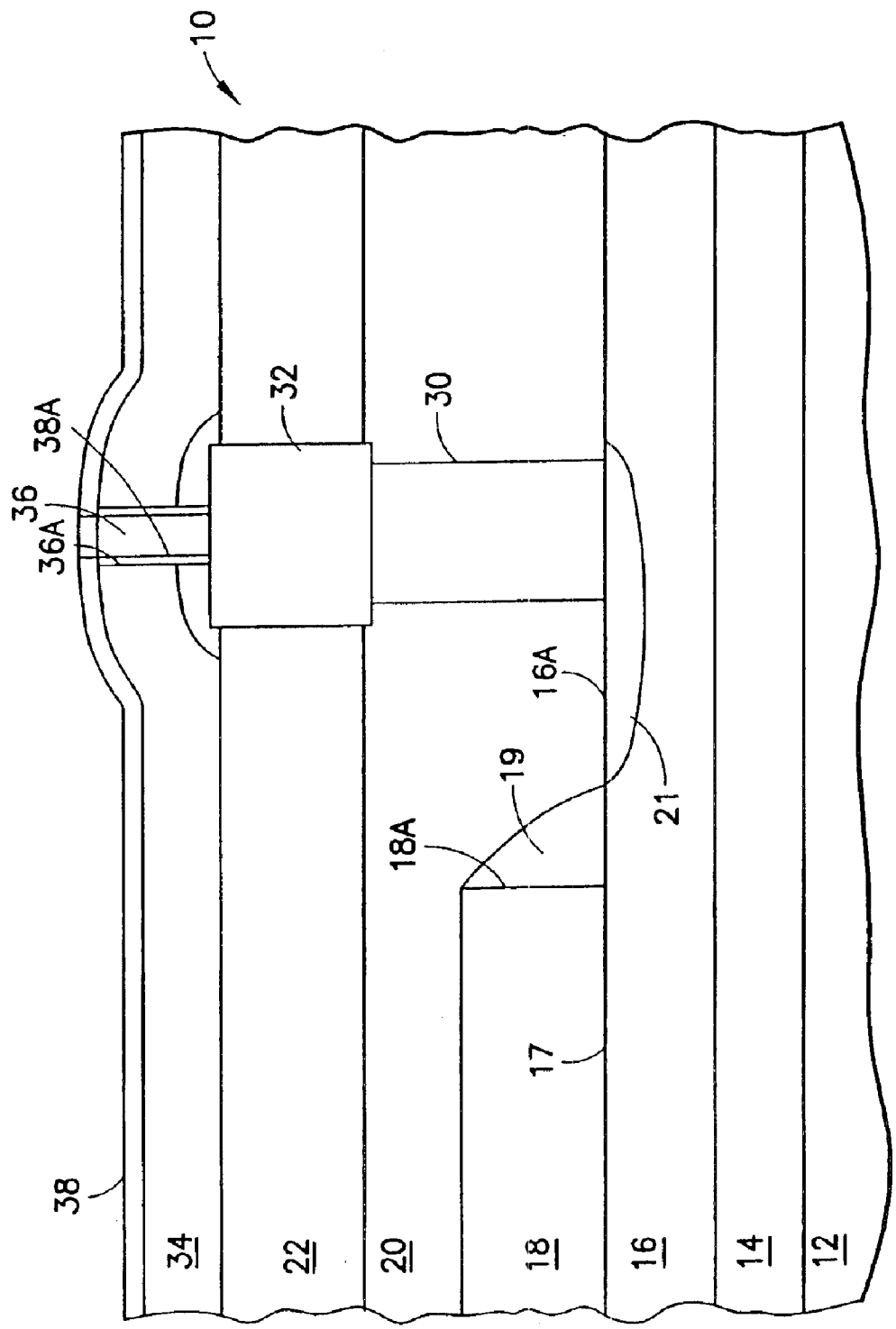

With reference now to FIG. 5, in one embodiment of the invention it is desirable to deposit a thin layer 38 of a high-k dielectric film conformally over the upper surface of the device. Such a film 'fills' or 'plugs' the nanoporous regions that otherwise exist within low-k dielectric layers 22, 24 proximate the exposed upper surface of conductor 32. In the described embodiment, layer 38 comprises TEOS formed by a conventional low pressure chemical vapor deposition process (LPCVD) or a plasma-enhanced chemical vapor deposition process (PECVD) to a thickness of about 500 Angstroms. Alternatively, titanium isoproxide, silicon nitride, diethylsilane or other high-k materials can be used to plug the nanopores and achieve the same result. Subsequent to the deposition of layer 38, an etching process such as FIB milling, focused CAIBE ion milling, RIE removal or selective wet etch removal is used to remove the horizontal regions of the layer leaving sidewalls 38A covering the surfaces of via 36.

The omission of 'plugging' or passivating layer 38 may result in lateral leakage paths or shorting paths through low-k dielectric layers 22, 24 that would diminish the ability to electrical test the underlying elements and devices.

Figure 6:
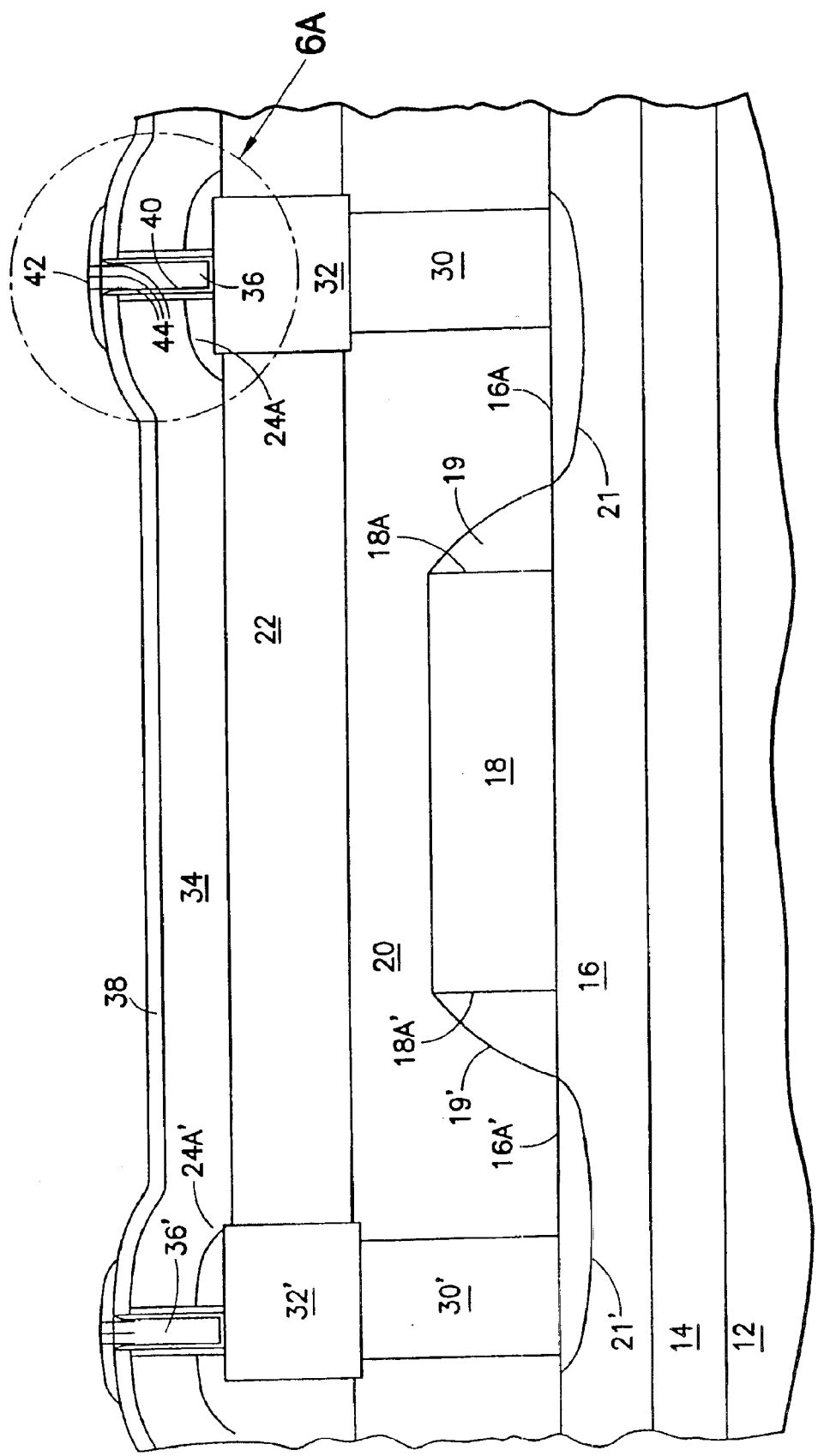
Figure 6A:
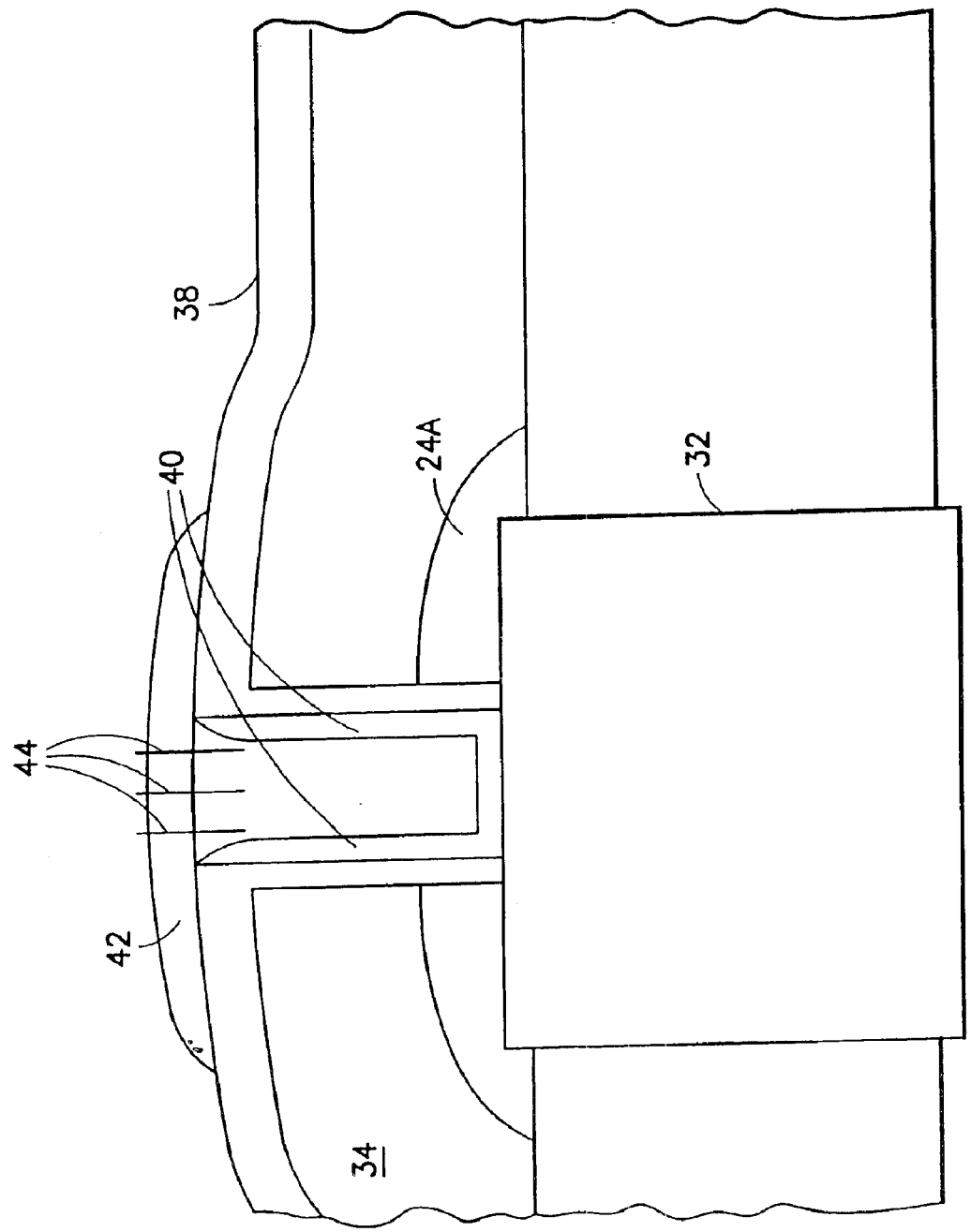
FIG. 6A is an enlarged view of a portion of FIG. 6.

With reference now to FIGS. 6 and 6A, it will be appreciated that to illustrate this particular embodiment of the invention, the size of the cross-sectional view shown in FIG. 6 has been expanded to include one full CMOS transistor with adjoining electrical conductors 30' and 32'. Like features to those described above are indicated by like, primed reference numerals. The layout of such devices is well known to those skilled in the art. FIG. 6A shows an expanded view of the region surrounding via 36.

For purposes of illustrating the present invention, concomitant with the ground rules for CMOS devices set out above, the lateral distance between conductors 32 and 32' is in the range of about or less than 0.25 microns.

Continuing with reference to FIGS. 6 and 6A, a conductive film 40 such as CVD tungsten or CVD platinum is deposited using a boxed focus aperture, low current (i.e. 35 picoamp or less beam current) FIB deposition process so as to coat the sidewalls and bottom of via 36, forming an electrical connection to the upper surface of conductor 32. Any necessary cleanup is performed in the FIB tool using ion milling or xenon diflouride gas to remove errant depositions.

A conductive pad 42, again of tungsten or platinum, is FIB deposited on top of layer 34 overlying conductive layer 40 and connected there by multiple FIB-deposited sub micron wires 44 of CVD tungsten or CVD platinum. The FIB deposition and cleanup processes used to form pad 42 and wires 44 is substantially identical to that used to form conductive layer 40 as described above.

With the conductive via fill, pad and wires 40, 42, 44 thus provided, the surface of pad 42 may be used for electrical probing. Electrical probing may be done using any conventional methodology, for example using tungsten-tipped microprobes to provide full electrical characterization of the device regions of interest.

In an alternate embodiment of the invention, conductive electrical contact is made through via 36 to conductor 32 for electrical probing by placing an electrical probe into the via. Such probing may be performed, for example, with the active probe of an atomic form microscopy or scanning probe microscopy (AFM/SPM) system or other probe sufficiently small to enter into or otherwise operate through via 36.

There are thus provided new and improved methods and structures for providing conductive contacts enabling the electrical probing of devices incorporating low-k dielectric films. The invention may be applied, for example and without limitation, to SRAM cells, DRAM cells, individual EFTs, discrete devices and serpentine and comb structures. Probing may be used, for example, to collect sensitive electrical characterization measurements for designing, modeling, design verification, failure analysis and other applications. The invention has particular application in the filed of semiconductor device design, fabrication and testing.

While the invention has been described with respect to particular embodiments, it is not thus limited. Numerous variations, changes and improvements contemplated by the invention will now occur to the reader.

What is claimed is:

1. A semiconductor structure comprising:

a buried semiconductor device;

a first conductor overlying said semiconductor device and to said semiconductor device;

a low-k dielectric layer surrounding said first conductor;

a low-k dielectric cap overlying said first conductor;

a high-k insulator layer deposited over said low-k dielectric cap;

a via through said high-k insulator layer and said low-k dielectric cap exposing a surface of said first conductor;

a passivating film of high-k dielectric insulator over the wall of said via; and a second conductor extending through said via over said passivating film to contact said first conductor.

2. A semiconductor structure comprising:

a silicon over-insulator semiconductor structure;

a buried semiconductor device formed in said silicon-over-insulator structure;

a first metal conductor overlying said semiconductor device and connected to said semiconductor device;

a low-k dielectric layer surrounding said first metal conductor;

a low-k dielectric cap overlying said first metal conductor;

a high-k insulator layer over said low-k dielectric cap;

a via through said high-k insulator layer and said low-k dielectric cap exposing a surface of said first metal conductor;

a passivating film of high-k dielectric insulator over the wall of said via; and a second metal conductor extending through said via over said passivating film to contact said first metal conductor.

3. The semiconductor structure of claim 2 wherein said first metal conductor includes a sub micron dimension.

4. The semiconductor structure of claim 2 wherein said via has a diameter in the range of about 0.10–0.20 microns.

* * * * *